United States Patent
Arango et al.

(10) Patent No.: US 8,525,303 B2
(45) Date of Patent: Sep. 3, 2013

(54) PHOTOVOLTAIC DEVICE INCLUDING SEMICONDUCTOR NANOCRYSTALS

(75) Inventors: Alexi Arango, Somerville, MA (US);
Vladimir Bulovic, Lexington, MA (US);
Vanessa Wood, Cambridge, MA (US);
Moungi G. Bawendi, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 180 days.

(21) Appl. No.: 12/666,623

(22) PCT Filed: Jun. 25, 2007

(86) PCT No.: PCT/US2007/014762
§ 371 (c)(1),
(2), (4) Date: Jan. 18, 2011

(87) PCT Pub. No.: WO2009/002305
PCT Pub. Date: Dec. 31, 2008

(65) Prior Publication Data
US 2011/0101479 A1    May 5, 2011

(51) Int. Cl.
*H01L 27/146*    (2006.01)

(52) U.S. Cl.
USPC ........... 257/615; 438/503; 438/507; 438/509; 438/478; 257/E21.09

(58) Field of Classification Search
USPC ............................................ 257/431
See application file for complete search history.

(56) References Cited

U.S. PATENT DOCUMENTS

| | | | |
|---|---|---|---|
| 4,625,071 A | 11/1986 | Delahoy et al. | |
| 5,293,050 A | 3/1994 | Chapple-Sokol et al. | |
| 6,320,117 B1 | 11/2001 | Campbell et al. | |
| 6,649,824 B1 * | 11/2003 | Den et al. | 136/256 |
| 2003/0230335 A1 | 12/2003 | Tsukahara | |
| 2007/0103068 A1 * | 5/2007 | Bawendi et al. | 313/506 |

FOREIGN PATENT DOCUMENTS

EP    1 087 446    3/2001

* cited by examiner

*Primary Examiner* — Zandra Smith
*Assistant Examiner* — Paul Patton
(74) *Attorney, Agent, or Firm* — Steptoe & Johnson LLP (57) ABSTRACT

A photovoltaic device includes a semiconductor nanocrystal and a charge transporting layer that includes an inorganic material. The charge transporting layer can be a hole or electron transporting layer. The inorganic material can be an inorganic semiconductor.

17 Claims, 4 Drawing Sheets

PHOTOVOLTAIC DEVICE INCLUDING SEMICONDUCTOR NANOCRYSTALS

FEDERALLY SPONSORED RESEARCH OR DEVELOPMENT

This invention was made with government support under grant number DAAD19-02-D-0002 awarded by the Army Research Office. The U.S. Government has certain rights to this invention.

CLAIM OF PRIORITY

This application claims priority under 35 USC 371 to International Application No. PCT/US2007/014762, filed on June 25, 2007, which is incorporated by reference in its entirety.

TECHNICAL FIELD

The present invention relates to photovoltaic devices including semiconductor nanocrystals.

BACKGROUND

Photovoltaic devices can produce electrical current in response to excitation of an active component of the device. Excitation can be stimulated by illuminating the device with an appropriate wavelength of light, while applying a voltage across the device. The absorptive component can be a polymer, such as a conjugated organic polymer or a polymer containing absorptive moieties or layers of organic molecules. The wavelength response profile, and other physical characteristics of the device, can be altered by the electronic structure (e.g., energy gaps) of the materials used.

SUMMARY

In general, a photovoltaic device can include a plurality of semiconductor nanocrystals. Semiconductor nanocrystals can be inorganic semiconductor particles, for example, 1-15 nm in diameter, optionally decorated with a layer of organic ligands. Nanocrystals can show strong quantum confinement effects that can be harnessed in designing bottom-up chemical approaches to create complex heterostructures with electronic and optical properties that are tunable with the size and composition of the nanocrystals.

Semiconductor nanocrystals can be used as the absorptive material in a photovoltaic device. Semiconductor nanocrystals can be dispersed in a liquid and are therefore compatible with thin-film deposition techniques such as spin-casting, drop-casting, and dip coating. However, bulk semiconductor nanocrystal solids resulting from these deposition techniques can have poor electrical transport properties in solid state devices. Rather than a bulk solid, a layer (e.g., a monolayer or multilayer) such as a thin film of semiconductor nanocrystals can be used in a photovoltaic device. A thin film provides the beneficial light absorption properties of semiconductor nanocrystals while minimizing the impact on electrical performance.

Devices using organic materials for the hole transporting or electron transporting layers (or both) can have high efficiency light-to-electricity conversion, but can suffer from short lifetimes due to the inherent instabilities of the organic materials. The inorganic nanocrystals themselves can be inherently more stable than their organic counterparts, as evidenced by photoluminescence studies. A device that utilizes semiconductor nanocrystals for absorption and inorganic semiconductors for electrical transport can achieve superior optoelectronic performance and long term stability. The inorganic semiconductors can be deposited by a low temperature method, such as sputtering, vacuum vapor deposition, ink jet printing, or ion plating.

Semiconductor nanocrystals can be deposited on a substrate using microcontact printing. Advantageously, microcontact printing allows micron-scale or nano-scale (e.g., less than 1 mm, less than 500 µm, less than 200 µm, less than 100 µm, less than 25 µm, or less than 1 µm) patterning of features on a surface. In particular, a monolayer of semiconductor nanocrystals can be deposited by microcontact printing. This approach can allow a substantially dry (i.e., substantially solvent-free) application of a patterned semiconductor nanocrystal film on a substrate. A wider variety of substrates can thus be used, because the choice of substrate is not constrained by solubility and surface chemistry requirements.

In one aspect, a photovoltaic device includes a first charge transporting layer including a first inorganic material in contact with a first electrode arranged to introduce charge in the first charge transporting layer, a second charge transporting layer in contact with a second electrode, wherein the second electrode is arranged to introduce charge in the second charge transporting layer, and a plurality of semiconductor nanocrystals disposed between the first charge transporting layer and the second charge transporting layer.

The first inorganic material can be amorphous or polycrystalline. The first inorganic material can be an inorganic semiconductor. The inorganic semiconductor can include a metal chalcogenide. The metal chalcogenide can be a mixed metal chalcogenide. The metal chalcogenide can include a zinc oxide, a titanium oxide, a niobium oxide, a zinc sulfide, an indium tin oxide, or a mixture thereof.

The second charge transporting layer can include a second inorganic material. The second inorganic material can be amorphous or polycrystalline. The second inorganic material can be an inorganic semiconductor. The inorganic semiconductor can include a metal chalcogenide. The metal chalcogenide can be a mixed metal chalcogenide. The metal chalcogenide can include a zinc oxide, a titanium oxide, a niobium oxide, a zinc sulfide, an indium tin oxide, or a mixture thereof.

The first charge transporting layer can be a hole transporting layer, or an electron transporting layer. The plurality of semiconductor nanocrystals can form a monolayer. The plurality of semiconductor nanocrystals can be a substantially monodisperse population of semiconductor nanocrystals. The device can be transparent. The second electrode can be in direct contact with the plurality of semiconductor nanocrystals.

The plurality of semiconductor nanocrystals can form a layer having a thickness of 4 nm to 2000 nm. The layer can have a thickness of less than 100 nm.

In another aspect, a method of forming a device, includes depositing a first charge transport layer including a first inorganic material over an electrode, depositing of plurality of semiconductor nanocrystals over the electrode, wherein the plurality of semiconductor nanocrystals is in electrical contact with the first charge transport layer, and depositing a second charge transport layer including a second inorganic material over the electrode, wherein the plurality of semiconductor nanocrystals is in electrical contact with the second charge transport layer.

Depositing the first inorganic material can include sputtering. Depositing the second inorganic material can include sputtering.

In another aspect, a method of generating current includes exposing a device to an excitation wavelength of light, wherein the device includes a first charge transporting layer including a first inorganic material in contact with a first electrode arranged to introduce charge in the first charge transporting layer, a second charge transporting layer in contact with a second electrode, wherein the second electrode is arranged to introduce charge in the second charge transporting layer, and a plurality of semiconductor nanocrystals disposed between the first charge transporting layer and the second charge transporting layer.

Other features, objects, and advantages of the invention will be apparent from the description and drawings, and from the claims.

DETAILED DESCRIPTION

A photovoltaic device can include two layers separating two electrodes of the device. The material of one layer can be chosen based on the material's ability to transport holes, or the hole transporting layer (HTL). The material of the other layer can be chosen based on the material's ability to transport electrons, or the electron transporting layer (ETL). The electron transporting layer typically can include an absorptive layer. When a voltage is applied and the device is illuminated, one electrode accepts holes (positive charge carriers) from the hole transporting layer, while the other electrode accepts electrons from the electron transporting layer; the holes and electrons originate as excitons in the absorptive material. The device can include an absorptive layer between the HTL and the ETL. The absorptive layer can include a material selected for its absorption properties, such as absorption wavelength or linewidth.

Figure 1:
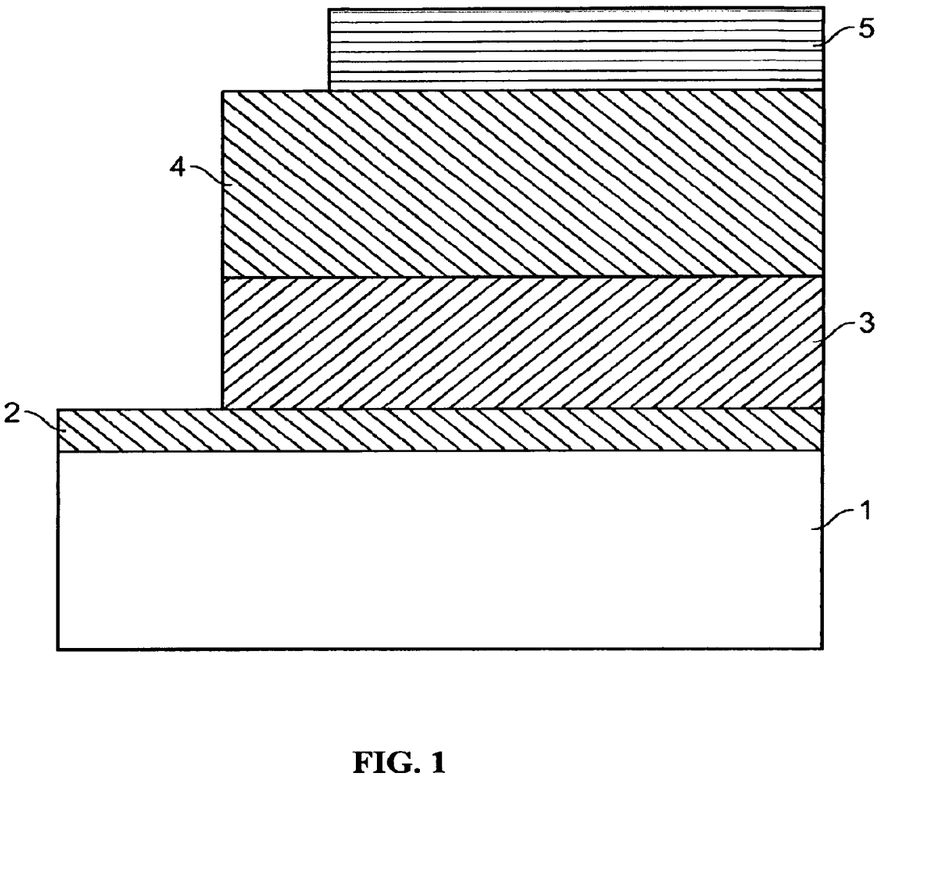
FIG. 1 is a schematic drawing depicting a photovoltaic device.

A photovoltaic device can have a structure such as shown in FIG. 1, in which a first electrode 2, a first layer 3 in contact with the electrode 2, a second layer 4 in contact with the layer 3, and a second electrode 5 in contact with the second layer 4. First layer 3 can be a hole transporting layer and second layer 4 can be an electron transporting layer. At least one layer can be non-polymeric. The layers can include an inorganic material. One of the electrodes of the structure is in contact with a substrate 1. Each electrode can contact a power supply to provide a voltage across the structure. Photocurrent can be produced by the absorptive layer when a voltage of proper polarity and magnitude is applied across the device. First layer 3 can include a plurality of semiconductor nanocrystals, for example, a substantially monodisperse population of nanocrystals.

Alternatively, a separate absorptive layer (not shown in FIG. 1) can be included between the hole transporting layer and the electron transporting layer. The separate absorptive layer can include the plurality of nanocrystals. A layer that includes nanocrystals can be a monolayer of nanocrystals, or a multilayer of nanocrystals. In some instances, a layer including nanocrystals can be an incomplete layer, i.e., a layer having regions devoid of material such that layers adjacent to the nanocrystal layer can be in partial contact. The nanocrystals and at least one electrode have a band gap offset sufficient to transfer a charge carrier from the nanocrystals to the first electrode or the second electrode. The charge carrier can be a hole or an electron. The ability of the electrode to transfer a charge carrier permits the photoinduced current to flow in a manner that facilitates photodetection.

Photovoltaic devices including semiconductor nanocrystals can be made by spin-casting a solution containing the HTL organic semiconductor molecules and the semiconductor nanocrystals, where the HTL formed underneath of the semiconductor nanocrystal monolayer via phase separation (see, for example, U.S. patent application Ser. No. 10/400, 907, filed Mar. 28, 2003, and U.S. patent application Publication No. 2004/0023010, each of which is incorporated by reference in its entirety). This phase separation technique reproducibly placed a monolayer of semiconductor nanocrystals between an organic semiconductor HTL and ETL, thereby effectively exploiting the favorable light absorption properties of semiconductor nanocrystals, while minimizing their impact on electrical performance. Devices made by this technique were limited by impurities in the solvent, by the necessity to use organic semiconductor molecules that are soluble in the same solvents as the semiconductor nanocrystals. The phase separation technique was unsuitable for depositing a monolayer of semiconductor nanocrystals on top of both a HTL and a HIL (due to the solvent destroying the underlying organic thin film). Nor did the phase separation method allow control of the location of semiconductor nanocrystals that emit different colors on the same substrate; nor patterning of the different color emitting nanocrystals on that same substrate.

Moreover, the organic materials used in the transport layers (i.e., hole transport, hole injection, or electron transport layers) can be less stable than the semiconductor nanocrystals used in the absorptive layer. As a result, the operational life of the organic materials limits the life of the device. A device with longer-lived materials in the transport layers can be used to form a longer-lasting light emitting device.

The substrate can be opaque or transparent. A transparent substrate can be used to in the manufacture of a transparent device. See, for example, Bulovic, V. et al., *Nature* 1996, 380, 29; and Gu, G. et al., *Appl. Phys. Lett.* 1996, 68, 2606-2608, each of which is incorporated by reference in its entirety. The substrate can be rigid or flexible. The substrate can be plastic, metal or glass. The first electrode can be, for example, a high work function hole-injecting conductor, such as an indium tin oxide (ITO) layer. Other first electrode materials can include gallium indium tin oxide, zinc indium tin oxide, titanium nitride, or polyaniline. The second electrode can be, for example, a low work function (e.g., less than 4.0 eV), electron-injecting, metal, such as Al, Ba, Yb, Ca, a lithium-aluminum alloy (Li:Al), or a magnesium-silver alloy (Mg:Ag). The second electrode, such as Mg:Ag, can be covered with an opaque protective metal layer, for example, a layer of Ag for protecting the cathode layer from atmospheric oxidation, or a relatively thin layer of substantially transparent ITO. The first electrode can have a thickness of about 500 Angstroms to 4000 Angstroms. The first layer can have a thickness of about 50 Angstroms to about 5 micrometers, such as a thickness in the range of 100 Angstroms to 100 nm, 100 nm to 1 micrometer, or 1 micrometer to 5 micrometers. The second layer can have a thickness of about 50 Angstroms to about 5 micrometers, such as a thickness in the range of 100 Angstroms to 100 nm, 100 nm to 1 micrometer, or 1 micrometer to 5 micrometers. The second electrode can have a thickness of about 50 Angstroms to greater than about 1000 Angstroms.

A hole transporting layer (HTL) or an electron transporting layer (ETL) can include an inorganic material, such as an inorganic semiconductor. The inorganic semiconductor can be any material with a band gap greater than the emission energy of the emissive material. The inorganic semiconductor can include a metal chalcogenide, metal pnictide, or elemental semiconductor, such as a metal oxide, a metal sulfide, a metal selenide, a metal telluride, a metal nitride, a metal phosphide, a metal arsenide, or metal arsenide. For example, the inorganic material can include zinc oxide, a titanium oxide, a niobium oxide, an indium tin oxide, copper oxide, nickel oxide, vanadium oxide, chromium oxide, indium oxide, tin oxide, gallium oxide, manganese oxide, iron oxide, cobalt oxide, aluminum oxide, thallium oxide, silicon oxide, germanium oxide, lead oxide, zirconium oxide, molybdenum oxide, hafnium oxide, tantalum oxide, tungsten oxide, cadmium oxide, iridium oxide, rhodium oxide, ruthenium oxide, osmium oxide, a zinc sulfide, zinc selenide, zinc telluride, cadmium sulfide, cadmium selenide, cadmium telluride, mercury sulfide, mercury selenide, mercury telluride, silicon carbide, diamond (carbon), silicon, germanium, aluminum nitride, aluminum phosphide, aluminum arsenide, aluminum antimonide, gallium nitride, gallium phosphide, gallium arsenide, gallium antimonide, indium nitride, indium phosphide, indium arsenide, indium antimonide, thallium nitride, thallium phosphide, thallium arsenide, thallium antimonide, lead sulfide, lead selenide, lead telluride, iron sulfide, indium selenide, indium sulfide, indium telluride, gallium sulfide, gallium selenide, gallium telluride, tin selenide, tin telluride, tin sulfide, magnesium sulfide, magnesium selenide, magnesium telluride, or a mixture thereof. The metal oxide can be a mixed metal oxide, such as, for example, ITO. In a device, a layer of pure metal oxide (i.e., a metal oxide with a single substantially pure metal) can develop crystalline regions over time degrading the performance of the device. A mixed metal oxide can be less prone to forming such crystalline regions, providing longer device lifetimes than available with pure metal oxides. The metal oxide can be a doped metal oxide, where the doping is, for example, an oxygen deficiency, a halogen dopant, or a mixed metal. The inorganic semiconductor can include a dopant. In general, the dopant can be a p-type or an n-type dopant. An HTL can include a p-type dopant, whereas an ETL can include an n-type dopant.

Single crystalline inorganic semiconductors have been proposed for charge transport to semiconductor nanocrystals in devices. Single crystalline inorganic semiconductors are deposited by techniques that require heating the substrate to be coated to a high temperature. However, the top layer semiconductors must be deposited directly onto the nanocrystal layer, which is not robust to high temperature processes, nor suitable for facile epitaxial growth. Epitaxial techniques (such as chemical vapor deposition) can also be costly to manufacture, and generally cannot be used to cover a large area, (i.e., larger than a 12 inch diameter wafer).

Advantageously, the inorganic semiconductor can be deposited on a substrate at a low temperature, for example, by sputtering. Sputtering is performed by applying a high voltage across a low-pressure gas (for example, argon) to create a plasma of electrons and gas ions in a high-energy state. Energized plasma ions strike a target of the desired coating material, causing atoms from that target to be ejected with enough energy to travel to, and bond with, the substrate.

The substrate or a the device being manufactured is cooled or heated for temperature control during the growth process. The temperature affects the crystallinity of the deposited material as well as how it interacts with the surface it is being deposited upon. The deposited material can be polycrystalline or amorphous. The deposited material can have crystalline domains with a size in the range of 10 Angstroms to 1 micrometer. Doping concentration can be controlled by varying the gas, or mixture of gases, which is used for the sputtering plasma. The nature and extent of doping can influence the conductivity of the deposited film, as well as its ability to optically quench neighboring excitons. By growing one material on top of another, p-n or p-i-n diodes can be created. The device can be optimized for delivery of charge to a semiconductor nanocrystal monolayer.

The layers can be deposited on a surface of one of the electrodes by spin coating, dip coating, vapor deposition, sputtering, or other thin film deposition methods. The second electrode can be sandwiched, sputtered, or evaporated onto the exposed surface of the solid layer. One or both of the electrodes can be patterned. The electrodes of the device can be connected to a voltage source by electrically conductive pathways. Upon application of the voltage, light is generated from the device.

Microcontact printing provides a method for applying a material to a predefined region on a substrate. The predefined region is a region on the substrate where the material is selectively applied. The material and substrate can be chosen such that the material remains substantially entirely within the predetermined area. By selecting a predefined region that forms a pattern, material can be applied to the substrate such that the material forms a pattern. The pattern can be a regular pattern (such as an array, or a series of lines), or an irregular pattern. Once a pattern of material is formed on the substrate, the substrate can have a region including the material (the predefined region) and a region substantially free of material. In some circumstances, the material forms a monolayer on the substrate. The predefined region can be a discontinuous region. In other words, when the material is applied to the predefined region of the substrate, locations including the material can be separated by other locations that are substantially free of the material.

In general, microcontact printing begins by forming a patterned mold. The mold has a surface with a pattern of elevations and depressions. A stamp is formed with a complementary pattern of elevations and depressions, for example by coating the patterned surface of the mold with a liquid polymer precursor that is cured while in contact with the patterned mold surface. The stamp can then be inked; that is, the stamp is contacted with a material which is to be deposited on a substrate. The material becomes reversibly adhered to the stamp. The inked stamp is then contacted with the substrate. The elevated regions of the stamp can contact the substrate while the depressed regions of the stamp can be separated from the substrate. Where the inked stamp contacts the substrate, the ink material (or at least a portion thereof) is transferred from the stamp to the substrate. In this way, the pattern of elevations and depressions is transferred from the stamp to the substrate as regions including the material and free of the material on the substrate. Microcontact printing and related techniques are described in, for example, U.S. Pat. Nos. 5,512,131; 6,180,239; and 6,518,168, each of which is incorporated by reference in its entirety. In some circumstances, the stamp can be a featureless stamp having a pattern of ink, where the pattern is formed when the ink is applied to the stamp. See U.S. patent application Ser. No. 11/253,612, filed Oct. 21, 2005, which is incorporated by reference in its entirety. Additionally, the ink can be treated (e.g., chemically or thermally) prior to transferring the ink from the stamp to the substrate. In this way, the patterned ink can be exposed to conditions that are incompatible with the substrate.

Figure 2:
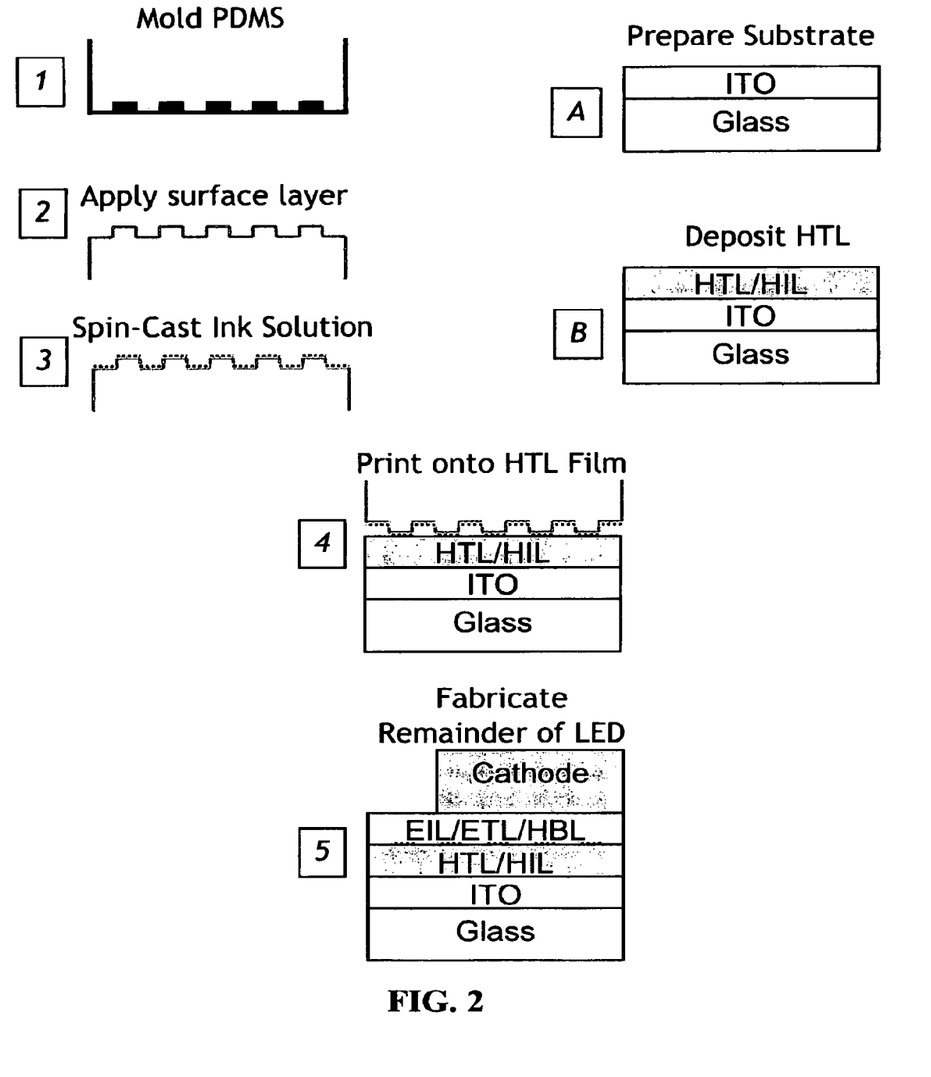
FIG. 2 is a diagram depicting a method of forming a photovoltaic device.

FIG. 2 depicts a flow chart outlining the basic steps in the microcontact printing process. First, a silicon master is made using standard semiconductor processing techniques which define a pattern on the silicon surface, for example a pattern of elevations and depressions (alternatively, for a non-patterned deposition, a blank Si master can be used). Poly dimethyl siloxane (PDMS, for example Sylgard 184) precursors are then mixed, degassed, poured onto the master, and degassed again, and allowed to cure at room temperature (or above room temperature, for faster cure times) (step 1). The PDMS stamp, having a surface including the pattern of the silicon master, is then freed from the master, and cut into the desired shape and size. This stamp is then coated with a surface chemistry layer, selected to readily adhere and release the ink as needed. For example, the surface chemistry layer can be a chemical vapor deposited Parylene-C layer. The surface chemistry layer can be, for example, 0.1 to 2 µm thick, depending on the pattern to be reproduced (step 2). This stamp is then inked, for example by spin-casting, syringe pump dispensing, or ink jet printing a solution of semiconductor nanocrystals (step 3). The solution can have, for example, a concentration of 1-10 mg/mL in chloroform. The concentration can be varied depending on desired outcome. The inked stamp can then be contacted to a substrate, and gentle pressure applied for, for example, 30 seconds to transfer the ink (i.e., a semiconductor nanocrystal monolayer) completely to the new substrate (step 4). FIGS. 2A and 2B depict the preparation of an ITO coated glass substrate. A hole transport and/or a hole injection layer (HTL and HIL, respectively) including organic semiconductor is thermally evaporated onto the ITO substrate. The patterned semiconductor nanocrystal layer is transferred to this HTL layer, and the rest of the device (e.g., electron transport layer (ETL), electron injection layer (EIL), and electrodes, as desired) can then be added (step 5). See, for example, U.S. patent application Ser. Nos. 11/253,595, and 11/253,612, both filed Oct. 21, 2005, and U.S. patent application Ser. No. 11/032,163, filed Jan. 11, 2005, each of which is incorporated by reference in its entirety.

When a nanocrystal absorbs a photon, an excited electron-hole pair results. The absorption wavelength is related to the effective band gap of the quantum confined semiconductor material. The band gap is a function of the size, shape, material, and configuration of the nanocrystal. Nanocrystals having small diameters can have properties intermediate between molecular and bulk forms of matter. For example, nanocrystals based on semiconductor materials having small diameters can exhibit quantum confinement of both the electron and hole in all three dimensions, which leads to an increase in the effective band gap of the material with decreasing crystallite size. Consequently, both the optical absorption and emission of nanocrystals shift to the blue, or to higher energies, as the size of the crystallites decreases.

The semiconductor forming the nanocrystals can include a Group II-VI compound, a Group II-V compound, a Group III-VI compound, a Group III-V compound, a Group IV-VI compound, a Group compound, a Group II-IV-VI compound, or a Group II-IV-V compound, for example, ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or mixtures thereof.

Methods of preparing monodisperse semiconductor nanocrystals include pyrolysis of organometallic reagents, such as dimethyl cadmium, injected into a hot, coordinating solvent. This permits discrete nucleation and results in the controlled growth of macroscopic quantities of nanocrystals.

Preparation and manipulation of nanocrystals are described, for example, in U.S. Pat. Nos. 6,322,901 and 6,576,291, and U.S. patent application Ser. No. 60/550,314, each of which is incorporated by reference in its entirety. The method of manufacturing a nanocrystal is a colloidal growth process. Colloidal growth occurs by rapidly injecting an M donor and an X donor into a hot coordinating solvent. The injection produces a nucleus that can be grown in a controlled manner to form a nanocrystal. The reaction mixture can be gently heated to grow and anneal the nanocrystal. Both the average size and the size distribution of the nanocrystals in a sample are dependent on the growth temperature. The growth temperature necessary to maintain steady growth increases with increasing average crystal size. The nanocrystal is a member of a population of nanocrystals. As a result of the discrete nucleation and controlled growth, the population of nanocrystals obtained has a narrow, monodisperse distribution of diameters. The monodisperse distribution of diameters can also be referred to as a size. The process of controlled growth and annealing of the nanocrystals in the coordinating solvent that follows nucleation can also result in uniform surface derivatization and regular core structures. As the size distribution sharpens, the temperature can be raised to maintain steady growth. By adding more M donor or X donor, the growth period can be shortened.

The M donor can be an inorganic compound, an organometallic compound, or elemental metal. M is cadmium, zinc, magnesium, mercury, aluminum, gallium, indium or thallium. The X donor is a compound capable of reacting with the M donor to form a material with the general formula MX. Typically, the X donor is a chalcogenide donor or a pnictide donor, such as a phosphine chalcogenide, a bis(silyl) chalcogenide, dioxygen, an ammonium salt, or a tris(silyl) pnictide. Suitable X donors include dioxygen, bis(trimethylsilyl) selenide (($TMS)_2Se$), trialkyl phosphine selenides such as (tri-n-octylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis(trimethylsilyl)telluride (($TMS)_2Te$), bis(trimethylsilyl)sulfide (($TMS)_2S$), a trialkyl phosphine sulfide such as (tri-n-octylphosphine) sulfide (TOPS), an ammonium salt such as an ammonium halide (e.g., $NH_4Cl$), tris(trimethylsilyl) phosphide (($TMS)_3P$), tris(trimethylsilyl) arsenide (($TMS)_3As$), or tris(trimethylsilyl) antimonide (($TMS)_3Sb$). In certain embodiments, the M donor and the X donor can be moieties within the same molecule.

A coordinating solvent can help control the growth of the nanocrystal. The coordinating solvent is a compound having a donor lone pair that, for example, has a lone electron pair available to coordinate to a surface of the growing nanocrystal. Solvent coordination can stabilize the growing nanocrystal. Typical coordinating solvents include alkyl phosphines, alkyl phosphine oxides, alkyl phosphonic acids, or alkyl phosphinic acids, however, other coordinating solvents, such as pyridines, furans, and amines may also be suitable for the nanocrystal production. Examples of suitable coordinating solvents include pyridine, tri-n-octyl phosphine (TOP), tri-n-octyl phosphine oxide (TOPO) and tris-hydroxylpropylphosphine (tHPP). Technical grade TOPO can be used.

Size distribution during the growth stage of the reaction can be estimated by monitoring the absorption line widths of the particles. Modification of the reaction temperature in response to changes in the absorption spectrum of the particles allows the maintenance of a sharp particle size distribution during growth. Reactants can be added to the nucleation solution during crystal growth to grow larger crystals.

By stopping growth at a particular nanocrystal average diameter and choosing the proper composition of the semiconducting material, the emission spectra of the nanocrystals can be tuned continuously over the wavelength range of 300 nm to 5 microns, or from 400 nm to 800 nm for CdSe and CdTe. The nanocrystal has a diameter of less than 150 Å. A population of nanocrystals has average diameters in the range of 15 Å to 125 Å.

The nanocrystal can be a member of a population of nanocrystals having a narrow size distribution. The nanocrystal can be a sphere, rod, disk, or other shape. The nanocrystal can include a core of a semiconductor material. The nanocrystal can include a core having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof.

The core can have an overcoating on a surface of the core. The overcoating can be a semiconductor material having a composition different from the composition of the core. The overcoat of a semiconductor material on a surface of the nanocrystal can include a Group II-VI compound, a Group II-V compound, a Group III-VI compound, a Group III-V compound, a Group IV-VI compound, a Group compound, a Group II-IV-VI compound, and a Group II-IV-V compound, for example, ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or mixtures thereof. For example, ZnS, ZnSe or CdS overcoatings can be grown on CdSe or CdTe nanocrystals. An overcoating process is described, for example, in U.S. Pat. No. 6,322,901. By adjusting the temperature of the reaction mixture during overcoating and monitoring the absorption spectrum of the core, over coated materials having high emission quantum efficiencies and narrow size distributions can be obtained. The overcoating can be between 1 and 10 monolayers thick.

The particle size distribution can be further refined by size selective precipitation with a poor solvent for the nanocrystals, such as methanol/butanol as described in U.S. Pat. No. 6,322,901. For example, nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected nanocrystal population can have no more than a 15% rms deviation from mean diameter, preferably 10% rms deviation or less, and more preferably 5% rms deviation or less.

The outer surface of the nanocrystal can include compounds derived from the coordinating solvent used during the growth process. The surface can be modified by repeated exposure to an excess of a competing coordinating group. For example, a dispersion of the capped nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the nanocrystal, including, for example, phosphines, thiols, amines and phosphates. The nanocrystal can be exposed to short chain polymers which exhibit an affinity for the surface and which terminate in a moiety having an affinity for a suspension or dispersion medium. Such affinity improves the stability of the suspension and discourages flocculation of the nanocrystal. Nanocrystal coordinating compounds are described, for example, in U.S. Pat. No. 6,251,303, which is incorporated by reference in its entirety.

More specifically, the coordinating ligand can have the formula:

wherein k is 2, 3 or 5, and n is 1, 2, 3, 4 or 5 such that k-n is not less than zero; X is O, S, S=O, $SO_2$, Se, Se=O, N, N=O, P, P=O, As, or As=O; each of Y and L, independently, is aryl, heteroaryl, or a straight or branched $C_{2-12}$ hydrocarbon chain optionally containing at least one double bond, at least one triple bond, or at least one double bond and one triple bond. The hydrocarbon chain can be optionally substituted with one or more $C_{1-4}$ alkyl, $C_{2-4}$ alkenyl, $C_{2-4}$ alkynyl, $C_{1-4}$ alkoxy, hydroxyl, halo, amino, nitro, cyano, $C_{3-5}$ cycloalkyl, 3-5 membered heterocycloalkyl, aryl, heteroaryl, $C_{1-4}$ alkylcarbonyloxy, $C_{1-4}$ alkyloxycarbonyl, $C_{1-4}$ alkylcarbonyl, or formyl. The hydrocarbon chain can also be optionally interrupted by —O—, —S—, —N($R^a$)—, —N($R^a$)—C(O)—O—, —O—C(O)—N($R^a$)—, —N($R^a$)—C(O)—N($R^b$)—, —O—C(O)—O—, —P($R^a$)—, or —P(O)($R^a$)—. Each of $R^a$ and $R^b$, independently, is hydrogen, alkyl, alkenyl, alkynyl, alkoxy, hydroxylalkyl, hydroxyl, or haloalkyl.

An aryl group is a substituted or unsubstituted cyclic aromatic group. Examples include phenyl, benzyl, naphthyl, tolyl, anthracyl, nitrophenyl, or halophenyl. A heteroaryl group is an aryl group with one or more heteroatoms in the ring, for instance furyl, pyiridyl, pyrrolyl, phenanthryl.

A suitable coordinating ligand can be purchased commercially or prepared by ordinary synthetic organic techniques, for example, as described in J. March, *Advanced Organic Chemistry*, which is incorporated by reference in its entirety.

Transmission electron microscopy (TEM) can provide information about the size, shape, and distribution of the nanocrystal population. Powder X-ray diffraction (XRD) patterns can provide the most complete information regarding the type and quality of the crystal structure of the nanocrystals. Estimates of size are also possible since particle diameter is inversely related, via the X-ray coherence length, to the peak width. For example, the diameter of the nanocrystal can be measured directly by transmission electron microscopy or estimated from X-ray diffraction data using, for example, the Scherrer equation. It also can be estimated from the UV/V is absorption spectrum.

Individual devices can be formed at multiple locations on a single substrate to form a photovoltaic array. In some applications, the substrate can include a backplane. The backplane includes active or passive electronics for controlling or switching power to or from individual array elements. Including a backplane can be useful for applications such as displays, sensors, or imagers. In particular, the backplane can be configured as an active matrix, passive matrix, fixed format, directly drive, or hybrid. See, e.g., U.S. patent application Ser. No. 11/253,612, filed Oct. 21, 2005, which is incorporated by reference in its entirety.

The device can be made in a controlled (oxygen-free and moisture-free) environment, preventing the quenching of device efficiency during the fabrication process. Other multilayer structures may be used to improve the device performance (see, for example, U.S. patent application Ser. Nos.

10/400,907 and 10/400,908, filed Mar. 28, 2003, each of which is incorporated by reference in its entirety). A blocking layer, such as an electron blocking layer (EBL), a hole blocking layer (HBL) or a hole and electron blocking layer (eBL), can be introduced in the structure. A blocking layer can include 3-(4-biphenylyl)-4-phenyl-5-tert-butylphenyl-1,2,4-triazole (TAZ), 3,4,5-triphenyl-1,2,4-triazole, 3,5-bis(4-tert-butylphenyl)-4-phenyl-1,2,4-triazole, bathocuproine (BCP), 4,4',4"-tris{N-(3-methylphenyl)-N-phenylamino}triphenylamine (m-MTDATA), polyethylene dioxythiophene (PEDOT), 1,3-bis(5-(4-diphenylamino)phenyl-1,3,4-oxadiazol-2-yl)benzene, 2-(4-biphenylyl)-5-(4-tert-butylphenyl)-1,3,4-oxadiazole, 1,3-bis[5-(4-(1,1-dimethylethyl)phenyl)-1,3,4-oxadiazol-2-yl]benzene, 1,4-bis(5-(4-diphenylamino)phenyl-1,3,4-oxadiazol-2-yl)benzene, or 1,3,5-tris[5-(4-(1,1-dimethylethyl)phenyl)-1,3,4-oxadiazol-2-yl]benzene.

The performance of photovoltaic devices can be improved by increasing their efficiency. See, for example, Bulovic et al., Semiconductors and Semimetals 64, 255 (2000), Adachi et al., Appl. Phys. Lett. 78, 1622 (2001), Yamasaki et al., Appl. Phys. Lett. 76, 1243 (2000), Dirr et al., Jpn. J. Appl. Phys. 37, 1457 (1998), and D'Andrade et al., MRS Fall Meeting, BB6.2 (2001), each of which is incorporated herein by reference in its entirety. Nanocrystals can be included in efficient hybrid organic/inorganic light emitting devices.

Individual devices can be formed at multiple locations on a single substrate to form a display. The display can include devices that emit at different wavelengths. By patterning the substrate with arrays of different color-emitting semiconductor nanocrystals, a display including pixels of different colors can be formed.

To form a device, a p-type semiconductor such as, for example, NiO can be deposited on a transparent electrode such as indium time oxide (ITO). The transparent electrode can be arranged on a transparent substrate. Then, semiconductor nanocrystals are deposited using a large-area compatible, single monolayer deposition technique such as microcontact printing or a Langmuir-Blodgett (LB) technique. Subsequently, an n-type semiconductor (e.g., ZnO or $TiO_2$) is applied, for example by sputtering, on top of this layer. A metal or semiconductor electrode can be applied over this to complete the device. More complicated device structures are also possible. For example, a lightly doped layer can be included proximal to the nanocrystal layer.

The device can be assembled by separately growing the two transport layers, and physically applying the electrical contacts using an elastomer such as polydimethylsiloxane (PDMS). This avoids the need for direct deposition of material on the nanocrystal layer.

The device can be thermally treated after application of all of the transport layers. The thermal treatment can further enhance separation of charges from the nanocrystals, as well as eliminate the organic capping groups on the nanocrystals. The instability of the capping groups can contribute to device instability.

The inorganic transport layers used, in particular metal-oxide materials can act as barrier layers to prevent $O_2$ and $H_2O$ from entering absorptive layer of the device (the semiconductor nanocrystal layer). The protective nature of the inorganic layer can provide design alternatives to the packaging. For example, because the inorganic layer can be a barrier to water and/or oxygen, the device can be built without the need for additional components to block such contaminants from reaching the emissive material. Encapsulant coatings such as BARIX (made by Vitex) are made using alternating layers of metal oxides and polymers. In such barriers, the metal oxides are the barriers to $O_2$ and $H_2O$, and the polymer layers randomize the occurrences of pin hole defects in the metal oxide layers. Thus, in using the metal oxides as transport layers, the device itself functions as a protective layer to the semiconductor nanocrystals.

Figure 3A:
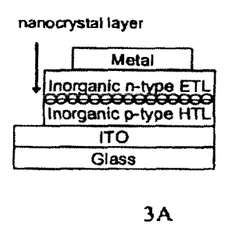
FIGS. 3A-3E are schematic drawings depicting photovoltaic devices.
Figure 3B:
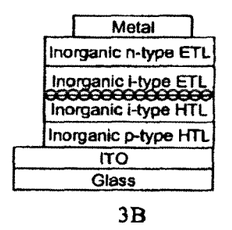
Figure 3C:
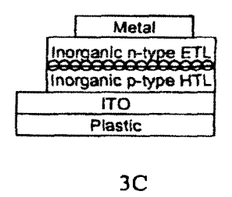
Figure 3D:
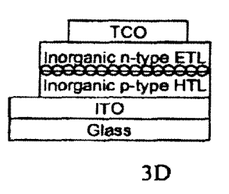
Figure 3E:
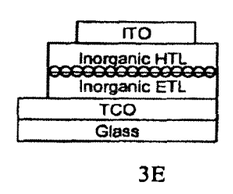

FIGS. 3A-3E show possible device structures. They are a standard p-n diode design (FIG. 3A), a p-i-n diode design (FIG. 3B), a transparent device (FIG. 3C), an inverted device (FIG. 3D), and a flexible device (FIG. 3E). In the case of the flexible device, it is possible to incorporate slippage layers, i.e. metal oxide/metal/metal oxide type three layer structures, for each single layer metal oxide layer. This has been shown to increase the flexibility of metal oxide thin films, increasing conductivity, while maintaining transparency. This is because the metal layers, typically silver, are very thin (roughly 12 nm each) and therefore do not absorb much light.

EXAMPLES

A 60 nm thick indium tin oxide (ITO) electrode was deposited on glass using rf-sputtering in an inert argon environment. A slow growth rate and low pressure were used to achieve a film with less than 5 nm of surface roughness, and heating the substrate allowed for precise control over the resistivity of the ITO. 20 nm of nickel oxide (NiO) were rf-sputtered on top of the ITO electrode in argon and oxygen, resulting in a p-type layer where the percent $O_2$ determines the number of excess hole donor sites. Colloidally synthesized zinc cadmium selenide (ZnCdSe) nanocrystals tuned to have an emission in the red were then spincoated onto the NiO. A slow spin rate was used to achieve several monolayers of nanocrystal coverage across the device area. Insulating zinc oxide (ZnO) and conductive tin oxide ($SnO_2$) were then co-sputtered in an argon environment to obtain a 40 nm film with a carrier concentration similar to that of the NiO. A silver top electrode was next deposited; however, the device can also be prepared by sputtering a top electrode of ITO or equally conductive zinc indium oxide.

Figure 4:
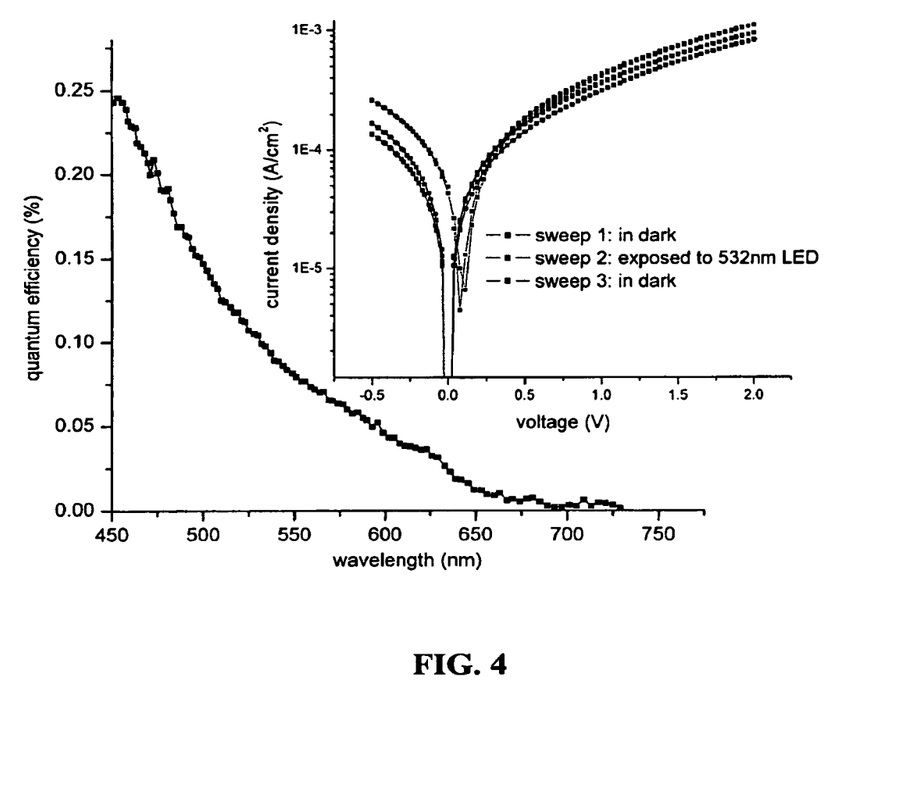
FIG. 4 is a graph depicting optical and electrical properties of a photovoltaic device.

FIG. 4 shows a the external quantum efficiency spectrum and I-V characteristics of the device. The wavelength dependent external quantum efficiency curve showed a small peak at 625 nm, demonstrating that the nanocrystals were responsible for the absorption of the incident light. The current-voltage plot shows the current response of the device in the dark and under illumination. The high dark currents (black and blue curves) can be attributed to the fact that the metal oxide layers are thin. The open circuit voltage of 0.2 was promising.

Other embodiments are within the scope of the following claims.

What is claimed is:
1. A photovoltaic device comprising:
a first charge transporting layer including a first inorganic material in contact with a first electrode arranged to introduce charge in the first charge transporting layer;
a second charge transporting layer in contact with a second electrode, wherein the second electrode is arranged to introduce charge in the second charge transporting layer; and
a plurality of semiconductor nanocrystals disposed between the first charge transporting layer and the second charge transporting layer, wherein the plurality of semiconductor nanocrystals is a substantially monodisperse population of semiconductor nanocrystals, and
wherein the first inorganic material is amorphous or polycrystalline.

2. The photovoltaic device of claim 1, wherein the first inorganic material is an inorganic semiconductor.

3. The photovoltaic device of claim 2, wherein the inorganic semiconductor includes a metal chalcogenide.

4. The photovoltaic device of claim 3, wherein the metal chalcogenide is a mixed metal chalcogenide.

5. The photovoltaic device of claim 3, wherein the metal chalcogenide includes a zinc oxide, a titanium oxide, a niobium oxide, a zinc sulfide, an indium tin oxide, or a mixture thereof.

6. The photovoltaic device of claim 1, wherein the second charge transporting layer includes a second inorganic material.

7. The photovoltaic device of claim 6, wherein the second inorganic material is amorphous or polycrystalline.

8. The photovoltaic device of claim 7, wherein the second inorganic material is an inorganic semiconductor.

9. The photovoltaic device of claim 8, wherein the inorganic semiconductor includes a metal chalcogenide.

10. The photovoltaic device of claim 9, wherein the metal chalcogenide is a mixed metal chalcogenide.

11. The photovoltaic device of claim 9, wherein the metal chalcogenide includes a zinc oxide, a titanium oxide, a niobium oxide, a zinc sulfide, an indium tin oxide, or a mixture thereof.

12. The photovoltaic device of claim 1, wherein the first charge transporting layer is a hole transporting layer.

13. The photovoltaic device of claim 1, wherein the first charge transporting layer is an electron transporting layer.

14. The photovoltaic device of claim 1, wherein the plurality of semiconductor nanocrystals form a monolayer.

15. The photovoltaic device of claim 1, wherein the device is transparent.

16. The device of claim 1, wherein the second electrode is in direct contact with the plurality of semiconductor nanocrystals.

17. A method of generating current, comprising:
exposing a device to an excitation wavelength of light, wherein the device includes:
a first charge transporting layer including a first inorganic material in contact with a first electrode arranged to introduce charge in the first charge transporting layer;
a second charge transporting layer in contact with a second electrode, wherein the second electrode is arranged to introduce charge in the second charge transporting layer; and
a plurality of semiconductor nanocrystals disposed between the first charge transporting layer and the second charge transporting layer, wherein the plurality of semiconductor nanocrystals is a substantially monodisperse population of semiconductor nanocrystals,
wherein the first inorganic material is amorphous or polycrystalline.

* * * * *